United States Patent [19]

George et al.

[11] Patent Number: 5,386,624
[45] Date of Patent: Feb. 7, 1995

[54] METHOD FOR UNDERENCAPSULATING COMPONENTS ON CIRCUIT SUPPORTING SUBSTRATES

[75] Inventors: Reed A. George, Lake Worth; Richard L. Mangold; Richard K. Brooks, both of Boynton Beach, all of Fla.

[73] Assignee: Motorola, Inc., Schaumburg, Ill.

[21] Appl. No.: 85,890

[22] Filed: Jul. 6, 1993

[51] Int. Cl.⁶ ................................................ H05K 3/30
[52] U.S. Cl. ........................................ 29/832; 29/840; 427/96
[58] Field of Search ............... 29/832, 840; 174/259; 427/96; 156/902

[56] References Cited

U.S. PATENT DOCUMENTS

| | | |
|---|---|---|
| 3,559,279 | 2/1971 | Miklaszewski . |
| 3,665,590 | 5/1972 | Percival . |
| 4,157,932 | 6/1979 | Hirata ........................ 174/259 X |
| 4,416,054 | 11/1983 | Thomas et al. . |
| 4,644,445 | 2/1987 | Sakuma ...................... 174/257 X |
| 4,779,338 | 10/1988 | Kohara et al. .................... 29/832 |
| 4,887,760 | 12/1989 | Yoshino et al. ................ 228/56.3 |
| 4,955,132 | 9/1990 | Ozawa ............................. 29/890 |
| 5,019,673 | 5/1991 | Juskey et al. ................... 174/52.2 |
| 5,022,580 | 6/1991 | Pedder ........................... 228/56.3 |
| 5,040,717 | 8/1991 | McGaffigan .................... 228/56.3 |
| 5,085,913 | 2/1992 | Wong ............................ 427/96 X |
| 5,106,011 | 4/1992 | Yamazaki et al. ................ 228/253 |
| 5,210,938 | 5/1993 | Hirai ............................... 29/840 |
| 5,274,913 | 1/1994 | Grebe et al. ..................... 29/840 |

FOREIGN PATENT DOCUMENTS

| | | | |
|---|---|---|---|
| 62-132331 | 6/1987 | Japan ...................... 437/211 |
| 62-145827 | 6/1987 | Japan ...................... 437/183 |
| 3-11694 | 1/1991 | Japan ....................... 29/840 |

*Primary Examiner*—Carl J. Arbes
*Attorney, Agent, or Firm*—James A. Lamb

[57] ABSTRACT

A method and apparatus for underencapsulating a component (502) on a substrate (402). The method robotically places an underencapsulant film (406) on at least one surface of a first surface of the component (502) and a second surface of a substrate (402), the first and second surfaces substantially opposing each other when the component (502) is placed on the substrate (402). Next, the method places the component (502) on the substrate (402) to dispose the underencapsulant film (406) between the first and second surfaces. The method then bonds (1006,1008 or 1006,1010) the component (502) to the substrate (402) with the underencapsulant (406).

12 Claims, 4 Drawing Sheets

METHOD FOR UNDERENCAPSULATING COMPONENTS ON CIRCUIT SUPPORTING SUBSTRATES

FIELD OF THE INVENTION

This invention relates generally to component bonding techniques and manufacturing technology, and more particularly, to a method and apparatus for underencapsulating components on a substrate.

BACKGROUND OF THE INVENTION

Reliability of operation is an important consideration for modern electronic devices, e.g., selective call receivers. Component packaging in an electronic device can significantly affect the reliability of the device by reducing component failures due to environmental hazards. These components, e.g., integrated circuits, crystals, linear components, electro-mechanical components, etc., are typically mounted on one or more circuit supporting substrates, e.g., printed circuit boards, in the device. As part of a packaging strategy, component failure in the device as a result of environmental hazards such as moisture, mechanical shock, thermal shock, etc., can be significantly reduced by utilizing underencapsulation in the component packaging as mounted on the circuit supporting substrate. This in turn enhances the overall operational reliability of the product, e.g., of the selective call receiver.

Known underencapsulation methods utilize liquid dispensing of the underencapsulant to apply the underencapsulant in a liquid state to the component on the substrate. These known methods have certain disadvantages discussed below.

First, conventional liquid dispensing techniques have proven troublesome to control because most of the materials used for these applications, e.g., for underencapsulants and for adhesives, are thixotropic, making consistent dispensing of controlled volumes very difficult to obtain. Also, liquid dispensers for these applications require cleaning after each and every use which adds significant maintenance cost to a manufacturing process. Further, the cleaning solvents required to clean the dispenser create environmental waste.

Second, the application of the liquid underencapsulant after the component is located on the substrate requires a "work area" or "keep out area" around the perimeter of the component on the substrate to be able to locate a dispenser thereabouts to apply the liquid. This of course wastes precious surface area of a substrate about each component which is then not available for locating other components.

Third, the liquid dispensing techniques require additional process steps to properly flow the liquid around and under the component without creating gas, e.g., air, pockets under the component. If air gets trapped inside pockets it can contaminate the underencapsulant with moisture. Trapped moisture creates an environmental hazard for the component which can result in operational failures after the product is in use.

Fourth, these process steps add complexity to the manufacturing process which can increase the number of opportunities for introducing defects during manufacturing. Consequently, this reduces the overall quality of the product.

Fifth, the curing steps required to protect against moisture being trapped can take much time. This reduces the efficiency of the manufacturing process which is contrary to modern mass manufacturing techniques.

Thus, in view of the desirability of underencapsulation of components and the difficulties with conventional underencapsulation methods, what is needed is an improved method and apparatus for underencapsulating components for component packaging in electronic devices.

SUMMARY OF THE INVENTION

According to an embodiment of the present invention, there is provided a method and apparatus for underencapsulating a component on a substrate. The method comprises the following three steps. First, robotically place a pre-cut underencapsulant film on at least one surface of a first surface of a component and a second surface of a substrate, the first and second surfaces substantially opposing each other when the component is placed on the substrate. Next, place the component on the substrate to dispose the underencapsulant film between the first and second surfaces. The method then bonds the component to the substrate with the underencapsulant.

DESCRIPTION OF A PREFERRED EMBODIMENT

Figure 1:
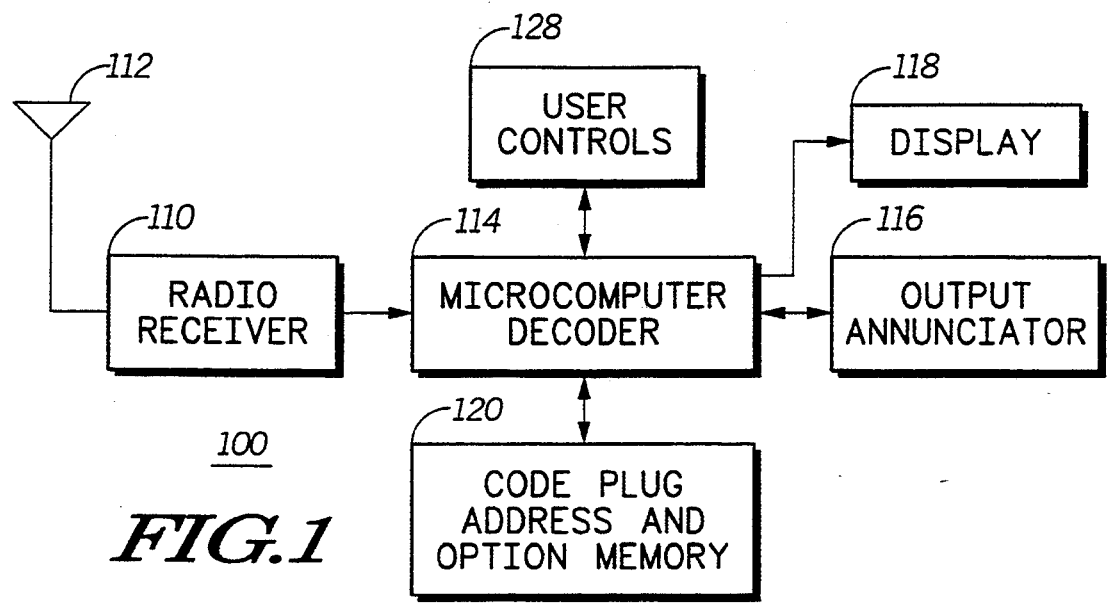
FIG. 1 is a block diagram of a paging receiver, in accordance with the present invention.

FIG. 1 is an electrical block diagram of an exemplary electronic device such as a selective call receiver, e.g. a pager 100. It includes radio receiver circuitry 110 which receives signals via an antenna 112. The received signals include paging information. Selective call receivers can respond to transmitted information containing various combinations of tone, tone and voice, or data messages in a variety of modes. This information may be transmitted using several paging coding schemes and message formats.

The output of the radio receiver circuitry 110 is applied to a microcomputer decoder 114 which processes the information contained in the received signals, to decode any received message. As can be seen, the microcomputer decoder 114 communicates with an output annunciator 116, such as a transducer or speaker, to alert a user that a message has been received, with a display 118, such as a liquid crystal display (LCD), to present a message via the display 118, and with a code plug address and option memory 120 to retrieve predetermined address and function information. Normally, after a received address matches a predetermined address in the pager 100, the output annunciator 116 alerts the user that a message has been received. The user can activate user controls 128, such as buttons or switches, to invoke functions in the pager 100, and optionally to view the received message on the display 118. The operation of a paging receiver of the general type shown in FIG. 1 is well known and is more fully described in U.S. Pat. No. 4,518,961, issued May 21, 1985, entitled "Universal Paging Device with Power Conservation", which is assigned to the same assignee as the present invention and is incorporated herein by reference.

Figure 2:
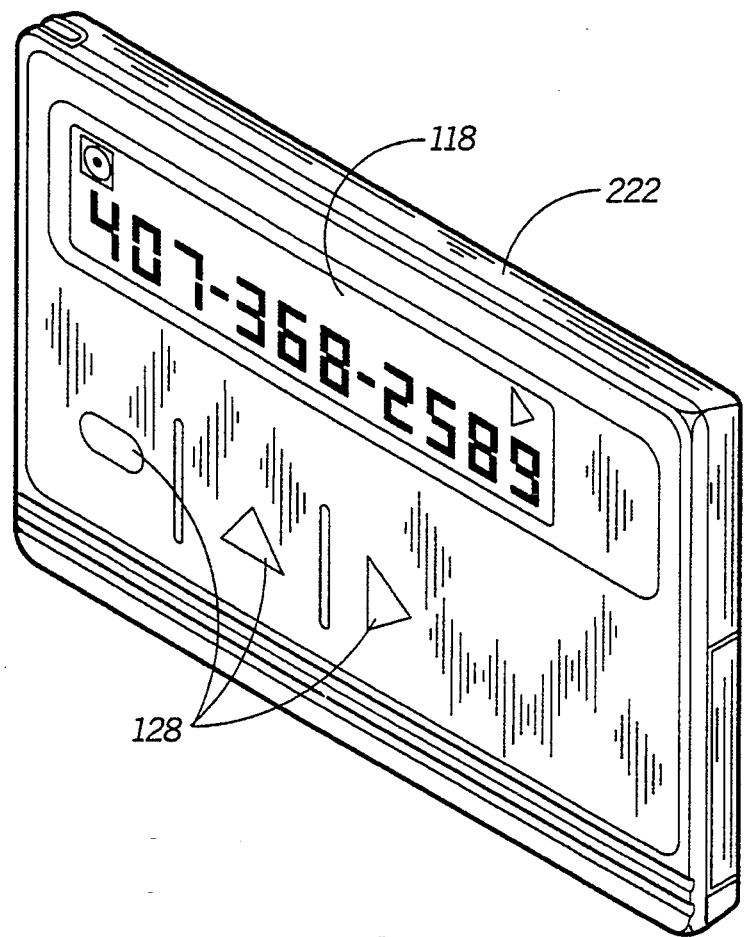
FIG. 2 is an isometric view of a paging receiver in a credit card format, in accordance with the present invention.

FIG. 2 is an isometric view of a paging receiver constructed in a low volumetric (e.g. credit card) format. As can be seen, the pager 100 includes a housing 222. A display 118 is visible through an aperture in the housing 222, and user operated controls 128 are also provided.

Figure 3:
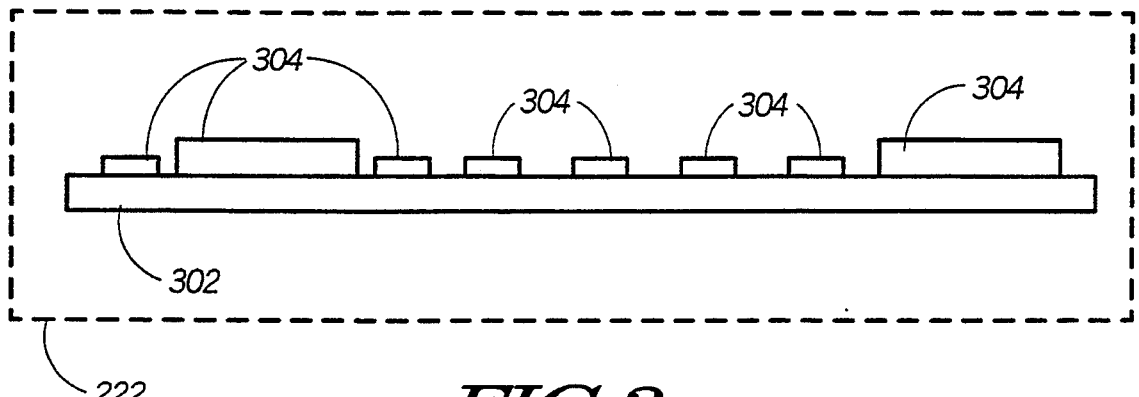
FIG. 3 is a side x-ray view of a pager housing enclosing a circuit supporting substrate having components mounted thereon, according to the preferred embodiment of the present invention.

FIG. 3 is a side x-ray view of the pager housing 222 enclosing a circuit supporting substrate 302, e.g., a printed circuit board, having components 302 mounted thereon. At least a portion of the electronic circuitry for the pager 100 is shown as the components 302. These components 302 may include the radio receiver circuitry 110 (FIG. 1), the microcomputer decoder 114, and the output annunciator 116, as well as other electronic circuitry performing functions for the pager 100. Additionally, while a single substrate 302 is shown for convenience, it should be clear that the electronic device could include more than one circuit supporting substrate with components mounted thereon respectively.

The components 302 on the circuit supporting substrate 302 may utilize a mounting arrangement comprising at least one of the following technologies: Flip-Chip, Over Molded Pad Array Carrier (OMPAC), Quad Flat Pack (QFP), Direct Chip Attach (DCA), Tape Automated Bonding (TAB), Crystal mounting techniques, and Flip Chip On Glass (FCOG) and Heat Seal Connector (HSC) technologies for mounting components on substrates such as used in liquid crystal displays (LCDs). More generally, any component mounting arrangement on a substrate where the component is underencapsulated on the substrate as part of the component packaging strategy may benefit by utilizing the present invention.

Figure 4:
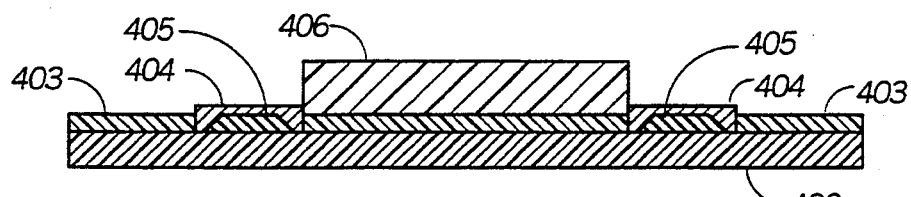
FIGS. 4, 5, and 6 are cross-sectional side views of an exemplary component being underencapsulated on a circuit supporting substrate, in accordance with the preferred embodiment of the present invention.
Figure 5:
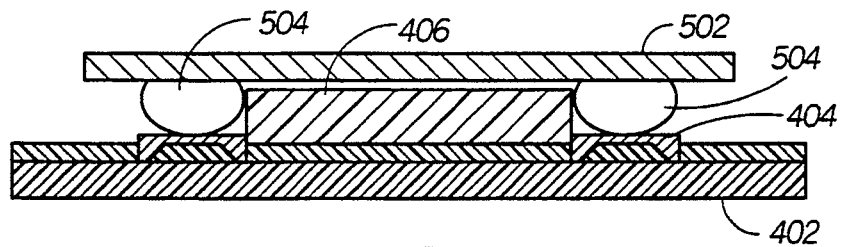
Figure 6:
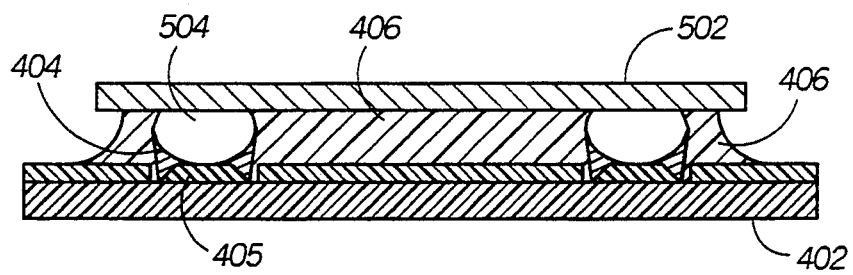
Figure 7:
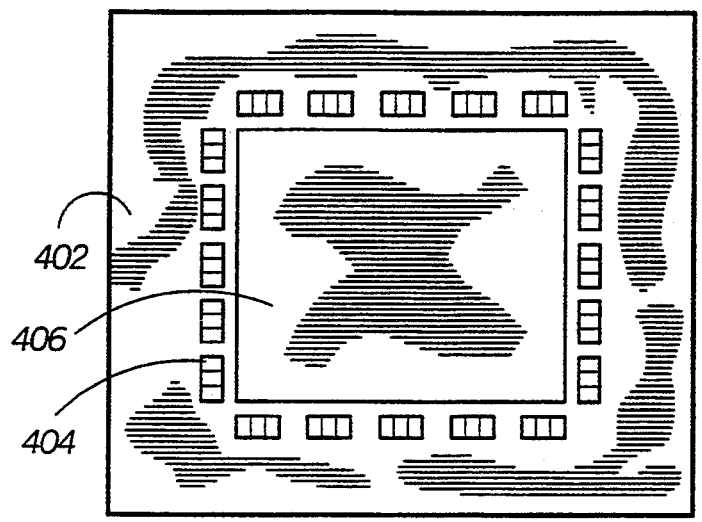
FIGS. 7, 8, and 9 are top views corresponding to FIGS. 4, 5, and 6, respectively, of the component being underencapsulated on the circuit supporting substrate, according to the preferred embodiment of the present invention.
Figure 8:
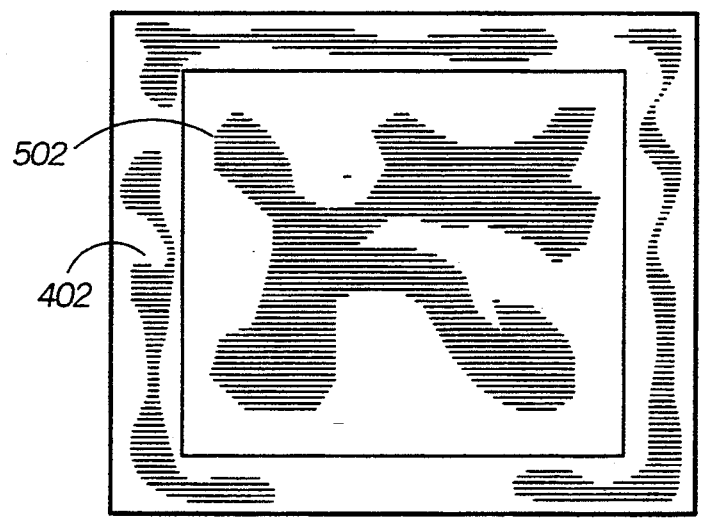
Figure 9:
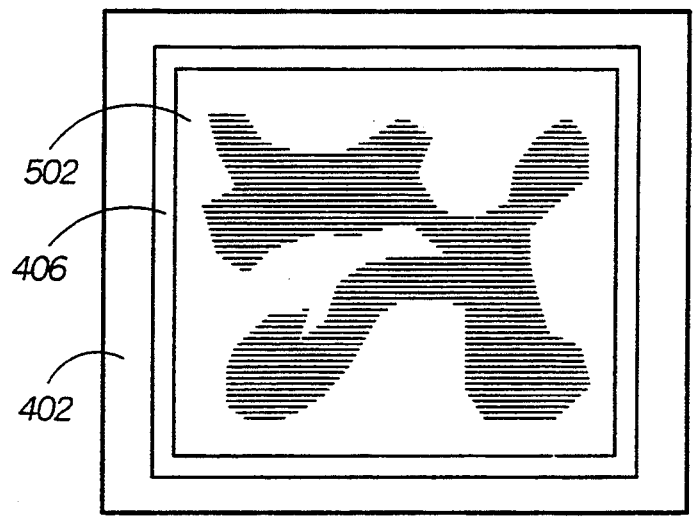

FIGS. 4, 5, and 6 are cross-sectional side views of an exemplary component 502 being underencapsulated on a circuit supporting substrate 402, in accordance with the preferred embodiment of the present invention. FIGS. 7, 8, and 9 are top views corresponding to FIGS. 4, 5, and 6, respectively. In this example, Flip-Chip technology is used to mount the component 502 on the substrate 402. However, as discussed above, other mounting technologies can be equally successfully applied while benefiting from the present invention.

Unlike the liquid underencapsulants of the prior art, with all the aforementioned disadvantages, the preferred embodiment of the present invention utilizes a film underencapsulant 406. This film underencapsulant 406 is preferably located on the substrate 402 prior to locating the component 502 thereon. The film underencapsulant 406 generally resides at a predetermined location corresponding to the mounting location of the component 502.

For example, as shown in FIGS. 4 and 7, the film underencapsulant 406 is placed on the surface of the substrate 402 within a perimeter of the component's predetermined mounting location, such as within the perimeter of outer pads 404 on the substrate 402. As shown in FIG. 5, these pads 404 on the substrate 402 correspond to lead pads 504 on the component 502 (component leads 504). When the pads 404 on the substrate 402 are mechanically coupled with the component leads 504, respectively, electrical signals can be electrically coupled between the component 502 and circuits on the circuit supporting substrate 402.

The pads 404 on the substrate 402 are shown presoldered 404, where a conductive bonding medium 404 such as solder or a conductive epoxy, is pre-applied to pad structures 405 on the substrate 402. Alternatively, component leads 504 may be pre-soldered, or even both the pad structures 405 and the component leads 504 may be presoldered. The solder 404 will conductively bond the pads 404 to the component leads 504 to provide the electrical coupling medium between the component 502 and the circuits on the substrate 402.

Optionally, as shown in FIGS. 4, 5, and 6, a solder-resist layer 403 has been pre-applied to the substrate 402 in a manner well known in the art. In certain applications, the solder-resist layer 403 can help constrain the flow of the solder 404 or other conductive bonding medium during a bonding step to bond the component 502 to the substrate 402.

The underencapsulant film 406 is preferably a non-conductive resin or epoxy film. Alternatively, the underencapsulant may comprise other types of underencapsulant materials, such as at least one of the following materials including urethane and silicone. The underencapsulant film 406 can be pre-cut (or pre-formed) to a predetermined pattern corresponding to the dimensions of the pre-determined mounting location on the substrate 402 for the component 502.

Although the underencapsulant film 406 is preferably located on the surface of the substrate 402 prior to locating the component 502 thereon, it can alternatively be pre-applied to the underside of the component body 502, i.e., a surface of the component 502 substantially opposing the surface of the substrate 402, prior to locating the component 502 on the substrate 402. In either case, upon placing the component 502 on the substrate 402 the underencapsulant layer 406 is interposed between the opposing surfaces of the component body 502 and the substrate 402.

By using a film underencapsulant 406 disposed between the component 502 and the substrate 402 the underencapsulant material is applied consistently to the surface areas that will bond the component 502 with the substrate 402. There is better control of the location and flow of the underencapsulant material. There is no problem with properly flowing a liquid around and under a component mounted on a substrate as in the prior art. There are no liquid dispensers to maintain. There are no solvents needed to clean liquid dispensers, reducing potential environmental hazards. There is no need for a "keep out area" around each component on the substrate, more efficiently utilizing available surface area on a substrate. The curing of the underencapsulant is much faster and can even take place during a bonding step. By curing and bonding in one step the potential for moisture contamination is significantly reduced or eliminated.

After a bonding step, the underencapsulant 406 will form a bonding medium between the component body 502 and the substrate 402. This underencapsulant bond 406 between the component 502 and the substrate 402 provides a seal against environmental hazards such as moisture and other contaminants. Further, it provides a mechanical bond that can act like a heat sink to absorb thermal shock on the component 502. Additionally, it can protect the component against mechanical shock vibrations by mechanically coupling the component body 502 to the substrate 402 over a large surface area of the component 502.

The bonding step, as illustrated in FIGS. 6 and 9, follows the component 502 being located on the substrate 402 with the underencapsulant film 406 being disposed therebetween, as shown in FIGS. 5 and 8. Preferably, although not necessarily, thermal compression bonding is applied between the component 502 and the substrate 402 to spread the underencapsulant layer 406 between the component body 502 and the substrate 402 to fill any voids therebetween. The solder 404 flows and conductively bonds the pad structures 405 with the component leads 504 on the component 502. Further, the underencapsulant 406 flows and fills all voids between the component 502 and the substrate 402 to provide an environmental seal therebetween, while allowing the conductive bonds 404 to electrically couple the component 502 with circuits on the substrate 402.

The bonding step preferably comprises two temperature bonding steps. First, the component leads are bonded with the conductive bonding medium 404 to the pad structures 405 on the substrate 402 at a first temperature. Then, a higher temperature bonding step flows the underencapsulant layer 406 to fill all voids between the component 502 and the substrate 402. Alternatively, this bonding process can be performed in a single temperature step, where the component leads 504 are conductively bonded to the pad structures 405 by the conductive bonding medium 404 and at essentially the same time the component body 502 is bonded to the substrate 402 by the underencapsulant layer 406.

Preferably, external pressure, such as from a robotic placing operation, is applied to the component 502 to bond the component 502 to the substrate 402. Alternatively, the component's weight may provide sufficient force to assist the underencapsulant layer 406 and the conductive bonding medium 404 to effect the necessary bonding between the corresponding structures of the component 502 and the substrate 402.

In one manufacturing approach, a robotic placing operation can provide localized heat and, if necessary, pressure to bond the component 502 to the substrate 402. In a different manufacturing approach, the component 502 can be placed on the substrate 402, and other components can also be placed on the substrate 402, before the entire substrate assembly, including the component(s) 502 on the substrate 402, is heated, e.g., in an oven, to bond the component(s) 502 to the substrate 402. In both manufacturing approaches discussed above the underencapsulant film 406 is preferably pre-located on the substrate 402, such as by robotic placing operations. These manufacturing approaches lend themselves well to an automated (or robotic) mass manufacturing process. However, manual placement and manufacturing techniques can also be used.

Figure 10:
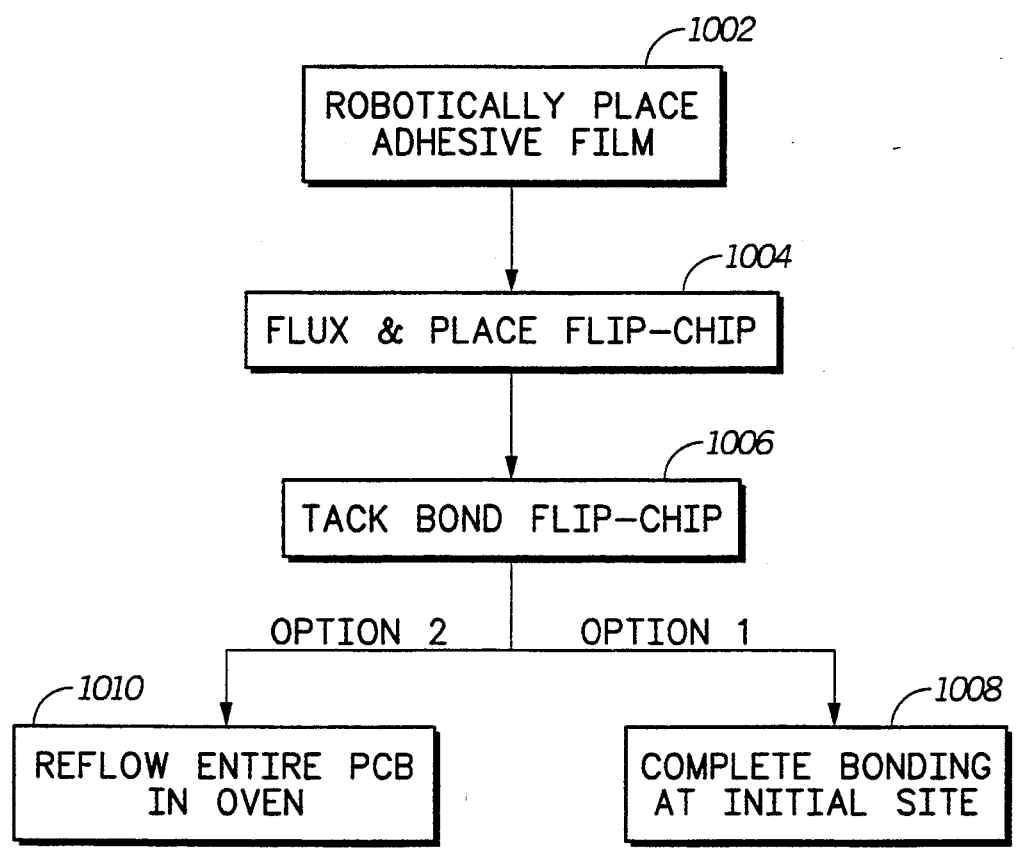
FIG. 10 is a flow diagram illustrating a manufacturing sequence for underencapsulating the component on the circuit supporting substrate, in accordance with the preferred embodiment of the present invention.

FIG. 10 is a flow diagram illustrating a manufacturing sequence for underencapsulating the component 502 on the circuit supporting substrate 402, in accordance with the preferred embodiment of the present invention. A robotic placement operation, at step 1002, places the underencapsulant film 406 on the substrate 402 at a predetermined location corresponding to the mounting location of the component 502. At step 1004, pads 404 on the substrate 402 are fluxed, preferably with no-clean flux, and the component 502 is placed on substrate 402 at the predetermined location. The component 502, at step 1006, is optionally tack bonded on the substrate 402 to hold the component body 502 at the predetermined location on the substrate 402. In a first option, at step 1008, bonding of the component 502 to the substrate 402 is completed after placement of the component at the predetermined location on the substrate 402. This is useful where a robotic placement operation can place and bond a component on a substrate during one placement operation. In a second option, at step 1010, the substrate 402 can be populated with one or more components 502 and then the entire substrate can be heated, such as in an oven, to bond the one or more components 502 to the substrate 402 and to cure the underencapsulant medium 406 therebetween. Thus, by utilizing a film underencapsulant 406 disposed between a component 502 and a substrate 402 to provide a bonding and sealing medium therebetween, the present invention overcomes the numerous disadvantages of the prior art liquid dispensing approach as discussed above.

What is claimed is:

1. A method for underencapsulating a component on a substrate, comprising the steps of:
   robotically placing a pre-cut underencapsulant film on at least one surface of a first surface of a component and a second surface of a substrate, the first and second surfaces substantially opposing each other when the component is placed on the substrate;
   placing the component on the substrate to dispose the underencapsulant film between the first and second surfaces; and
   bonding the component to the substrate with the underencapsulant.

2. The method of claim 1, wherein the bonding step comprises the step of thermocompressively bonding the component to the substrate with the underencapsulant.

3. The method of claim 1, further comprising the step of conductively bonding the component to the substrate to electrically couple the component to electrical circuits on the substrate.

4. The method of claim 3, wherein the conductively bonding of the component to the substrate is performed substantially contemporaneous to the bonding of the component to the substrate with the underencapsulant.

5. The method of claim 3, wherein the conductively bonding step includes the steps of:
   locating leads of the component with corresponding pads of the substrate; and
   conductively bonding the leads with the pads to provide electrical coupling between the component and the electrical circuits on the substrate.

6. The method of claim 1, wherein the component is mounted to the substrate by a component mounting technology selected from a group of component mounting technologies consisting of Flip-Chip, OMPAC, QFP, DCA, TAB, FCOG, and HSC.

7. The method of claim 1, wherein the underencapsulant film comprises at least one material selected from a group of materials consisting of epoxy, urethane, and silicone.

8. The method of claim 1, wherein the component is selected from a group of components consisting of an integrated circuit, a crystal, and an electro-mechanical device.

9. The method of claim 1, wherein the substrate is selected from a group of substrates consisting of a circuit supporting substrate, a printed circuit board, and a liquid crystal display.

10. A method for manufacturing an electronic device, the electronic device comprising a component and a substrate, the method comprising the steps of:
    robotically placing a pre-cut underencapsulant film on a surface of a substrate;
    placing a component on the substrate such that the underencapsulant film is substantially disposed between the component and the substrate; and
    bonding the component to the substrate with the underencapsulant film.

11. The method of claim 10, wherein the bonding step comprises the steps of:
    heating the component and the underencapsulant film on the substrate; and
    pressing the component on the substrate with the underencapsulant film therebetween.

12. The method of claim 11, wherein the heating step comprises the steps of:
    heating the component and the underencapsulant film on the substrate to a first temperature to flow a conductive bonding medium between leads of the component and pads of the substrate to provide a conductive bond therebetween; and
    heating the component and the underencapsulant film on the substrate to a second temperature to flow the underencapsulant film to fill voids between the component and the substrate.

* * * * *